(12) United States Patent
Moumen et al.

(10) Patent No.: US 10,726,646 B2
(45) Date of Patent: Jul. 28, 2020

(54) SERIAL COMMUNICATION SYSTEM FOR AUTOMOTIVE CIRCUITS

(71) Applicant: Valeo North America, Inc, Troy, MI (US)

(72) Inventors: Monji Moumen, Seymour, IN (US); Gauri Kelkar, Seymour, IN (US); Sylvain Larribe, Seymour, IN (US)

(73) Assignee: Valeo North America, Inc., Troy, MI (US)

( * ) Notice: Subject to any disclaimer, the term of this patent is extended or adjusted under 35 U.S.C. 154(b) by 176 days.

(21) Appl. No.: 15/991,658

(22) Filed: May 29, 2018

(65) Prior Publication Data

US 2019/0371089 A1 Dec. 5, 2019

(51) Int. Cl.
  *B60Q 11/00* (2006.01)
  *G07C 5/00* (2006.01)
  *G07C 5/08* (2006.01)
  *G01R 31/00* (2006.01)
  *B60Q 1/00* (2006.01)
  *B60Q 1/076* (2006.01)

(52) U.S. Cl.
  CPC ......... *G07C 5/0808* (2013.01); *B60Q 1/0023* (2013.01); *B60Q 1/0094* (2013.01); *B60Q 1/076* (2013.01); *B60Q 11/005* (2013.01); *G01R 31/007* (2013.01); *G07C 5/0841* (2013.01)

(58) Field of Classification Search
  None
  See application file for complete search history.

(56) References Cited

U.S. PATENT DOCUMENTS

| | | | |
|---|---|---|---|
| 6,216,060 B1* | 4/2001 | Kishimoto | B62J 99/00 701/1 |
| 2012/0035804 A1* | 2/2012 | Roberts | G07C 5/0808 701/33.2 |
| 2016/0121792 A1* | 5/2016 | Christopherson | B60D 1/64 340/431 |

* cited by examiner

*Primary Examiner* — Adam D Tissot
(74) *Attorney, Agent, or Firm* — Valeo North America, Inc.

(57) ABSTRACT

A serial communication system for a vehicle including an interface circuitry that generates a triggering signal, and a controller circuitry with an input block, an output block, a controller connected to the input block and the output block, the controller being configured to function in a normal mode or in a diagnostic mode, wherein in the normal mode the controller receives a sensing signal and provides an actuating signal based on the sensing signal, and in the diagnostic mode the input block transmits an input communication signal from the interface circuitry and the output block transmits an output communication signal from the controller to the interface circuitry, and a Diagnostic mode detector connected to the input block and configured to receive the triggering signal detect the triggering signal, and switch the controller from the normal mode to the diagnostic mode when the triggering signal is detected.

20 Claims, 8 Drawing Sheets

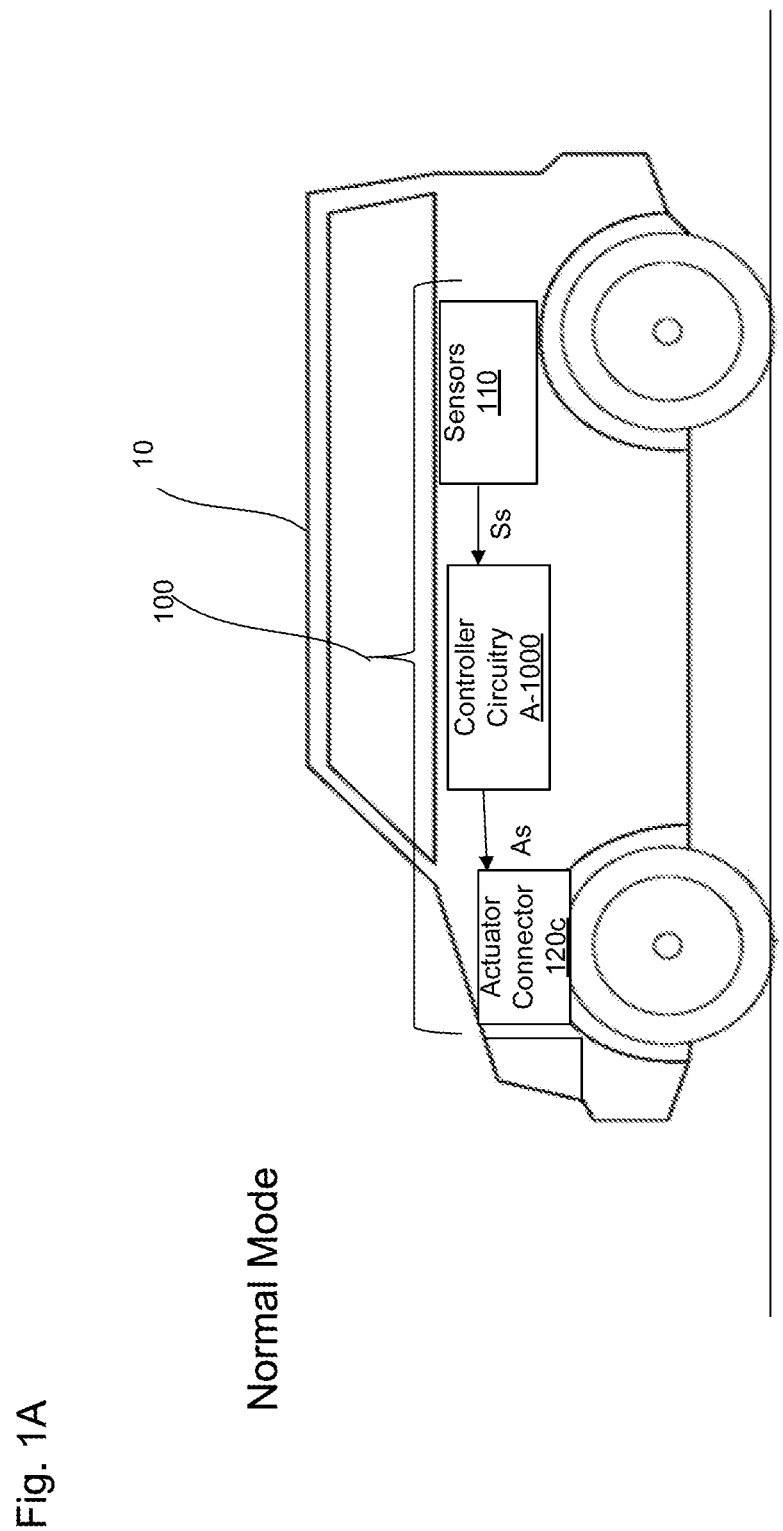

Diagnostic Mode

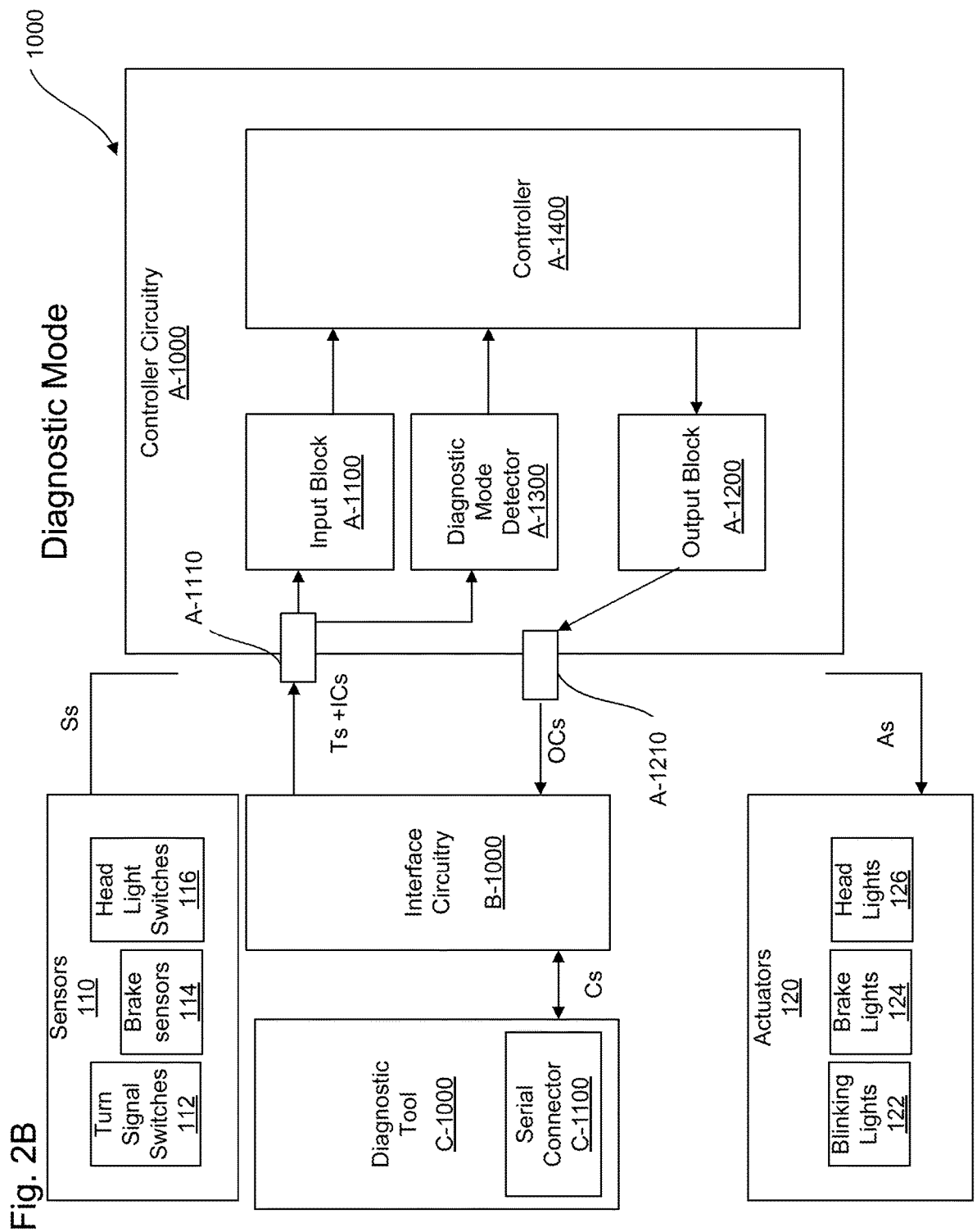

SERIAL COMMUNICATION SYSTEM FOR AUTOMOTIVE CIRCUITS

BACKGROUND

Field of the Disclosure

The present disclosure relates to automotive lighting systems, and in particular to serial communication systems in automotive lights.

Description of the Related Art

In today's automotive industry, lighting systems rely heavily on control circuits that control operations and functionalities of lighting sources of the lighting systems based on driving needs and/or conditions. For example, the control circuits can be responsible for detecting a low level of light intensity and activating head lights, detecting braking and activating braking lights, and/or detecting turning and activation turning lights.

These control circuits often need to be placed in communication with external tools to perform diagnostics, and/or maintenance tasks such as rebooting, reprogramming, or the like.

To this end, conventional diagnostic tools that connect to the control circuits and establish communication with the control circuits are employed. Although these conventional diagnostic tools are often used they present important drawbacks. Notably, these conventional diagnostic tools establish communication with the control circuits through LIN pins mounted into the control circuits. The presence of these LIN pins may represent an extra cost in manufacturing the control circuits as well as an increase in the size of the control circuits which is often limited in automotive lighting systems.

Thus, a serial communication system that overcomes the above limitations is needed.

SUMMARY

Accordingly, one of the objects of the present disclosure is to provide a serial communication system that overcomes the above limitations by establishing communication with the controller circuitry through input and output pins and without requiring a LIN pin.

In one non-limiting illustrative example, a lighting system for a vehicle is presented. The lighting system includes an interface circuitry that generates at least one triggering signal, and a controller circuitry including an input block, an output block, a diagnostic mode detector configured to receive the at least one triggering signal, and detect the at least one triggering signal, and a controller connected to the input block, the output block and the diagnostic mode detector, the controller being configured to function in a normal mode or in a diagnostic mode when the the at least one triggering signal is detected by the diagnostic mode detector, wherein in the normal mode the controller receives at least one sensing signal and provides at least one actuating signal based on the at least one sensing signal, and in the diagnostic mode the input block transmits at least one input communication signal from the interface circuitry and the output block transmits at least one output communication signal from the controller to the interface circuitry.

In another aspect, the multi-plateau function comprises a first plateau at a first voltage threshold during a first period, a second plateau at a second voltage threshold during a second period, and a third plateau at a third voltage threshold during a third period.

In another aspect, the second voltage threshold is higher than the first voltage threshold and the third voltage threshold is lower than the first voltage threshold.

In another aspect, the first voltage threshold is between 2.00 V and 3.40 V, the second voltage threshold is between 3.50 V and 6.50 V, and the third voltage threshold is between −0.30 V and 0.30 V.

In another aspect, the first period, the second period, and the third period are substantially equal.

In another aspect, the first period is between 80 ms and 110 ms.

In another aspect, the actuators are light sources of the vehicle.

In another aspect, the at least one input communication signal and the at least one output communication signal are commensurate with performing diagnostics on the controller.

In another aspect, the interface circuitry includes a pattern generator to produce the at least one triggering signal.

In one non-limiting illustrative example, a serial communication system for a vehicle is presented. The serial communication system includes In one aspect, the at least one triggering signal includes time dependent voltage values that follow a multi-plateau function.

In another aspect, the multi-plateau function is characterized by a first plateau at a first voltage threshold during a first period, a second plateau at a second voltage threshold during a second period, and a third plateau at a third voltage threshold during a third period.

In another aspect, the second voltage threshold is higher than the first voltage threshold and the third voltage threshold is lower than the first voltage threshold.

In another aspect, the interface circuitry includes a pattern generator to produce the at least one triggering signal.

In one non-limiting illustrative example, a controller circuitry for a vehicle is presented. The controller circuitry includes an input block, an output block, a controller connected to the input block and the output block, the controller being configured to function in a normal mode or in a diagnostic mode, wherein in the normal mode the controller receives at least one sensing signal and provides at least one actuating signal based on the at least one sensing signal, and in the diagnostic mode the input block receives at least one input communication signal and the output block sends at least one output communication signal, and a diagnostic mode detector connected to the input block and configured to receive at least one triggering signal, detect the at least one triggering signal, and switch the controller from the normal mode to the diagnostic mode when the at least one triggering signal is detected.

In one aspect, the at least one triggering signal includes time dependent voltage values that follow a multi-plateau function.

In another aspect, the multi-plateau function is characterized by a first plateau at a first voltage threshold during a first period, a second plateau at a second voltage threshold during a second period, and a third plateau at a third voltage threshold during a third period.

In another aspect, the second voltage threshold is higher than the first voltage threshold and the third voltage threshold is lower than the first voltage threshold.

In another aspect, the first voltage threshold is between 2.00 V and 3.40 V, the second voltage threshold is between 3.50 V and 6.50 V, and the third voltage threshold is between −0.30 V and 0.30 V.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 1A is a side view of a lighting system in a normal mode of operation, according to certain aspects of the disclosure;

FIG. 2B is a schematic view of a serial communication system of the lighting system in the diagnostic mode of operation, according to certain aspects of the disclosure;

DETAILED DESCRIPTION

Figure 1B:
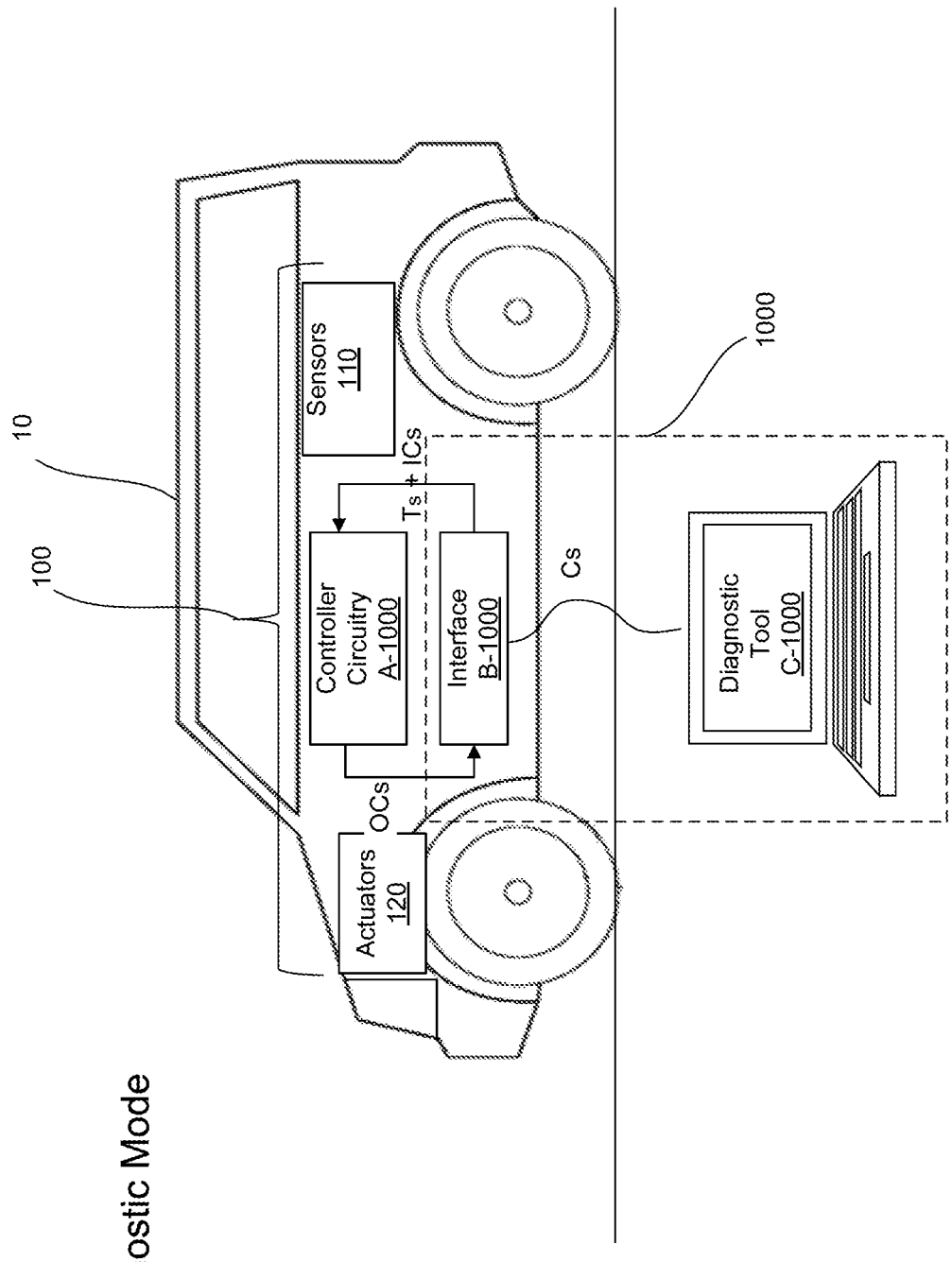
FIG. 1B is a side view of the lighting system in a diagnostic mode of operation, according to certain aspects of the disclosure.

The materials, methods, and examples discussed herein are illustrative only and are not intended to be limiting.

In the drawings, like reference numerals designate identical or corresponding parts throughout the several views. Further, as used herein, the words "a", "an", and the like include a meaning of "one or more", unless stated otherwise. The drawings are generally drawn not to scale unless specified otherwise or illustrating schematic structures or flowcharts.

The features of the present disclosure provide improvements in the technical field of automotive lighting, and specifically in the field of automotive light guides.

It is to be understood that terms such as "front," "rear," and the like that may be used herein merely describe points of reference and do not necessarily limit embodiments of the present disclosure to any particular orientation or configuration. Furthermore, terms such as "first," "second," "third," etc., merely identify one of a number of portions, components, and/or points of reference as disclosed herein, and likewise do not necessarily limit embodiments of the present disclosure to any particular configuration or orientation.

Furthermore, the terms "approximately," "proximate," "minor," and similar terms generally refer to ranges that include the identified value within a margin of 20%, 10% or preferably 5% in certain embodiments, and any values therebetween.

FIGS. 1A-1B is a side view of a lighting system 100 in a normal mode of operation and in a diagnostic mode of operation, according to certain aspects of the disclosure.

A lighting system 100 of a vehicle 10 can include sensors 110, e.g. turn signal switches 112, brake sensors 114, head light switches 116, see FIG. 2, or the like, actuators 120 with actuator connectors 120c, e.g. blinking lights 122, brake lights 124, head lights 126, see FIG. 2, assistance parking sensors, or the like, and a controller circuitry A-1000 connected to the sensors 110 and the actuators 120. In a normal mode of operation as illustrated in FIG. 1B, the sensors 110 can provide sensing signals Ss commensurate with driving needs and/or conditions, e.g. needs to turn, brake, see through low luminosity, or the like, the controller circuitry A-1000 can receive the sensing signals Ss, execute software instructions, and provide actuation signals As based on the sensing signals Ss, and the actuators 120 can receive the actuation signals As and actuate the light sources according to the actuation signals As, e.g. actuate the blinking lights 122, the brake lights 124, the head lights 126, or the like.

The light sources can be any type of light sources commonly used in the vehicle 10 such as light emitting diodes (LEDs), organic light emitting diodes (OLEDs), polymer light emitting diodes (PLEDs), and/or monolithic LEDs.

A serial communication system 1000 of the vehicle 10 can include an interface B-1000 connected to the controller circuitry A-1000 and a diagnostic tool C-1000 connected to the interface B-1000. In the diagnostic mode of operation as illustrated in FIG. 1B, the diagnostic tool C-1000 can be used to perform diagnostics on the lighting system 100 and/or reprogram the controller circuitry A-1000 via communication signals Cs between the diagnostic tool C-1000 and the interface B-1000, while the interface B-1000 provides communication between the controller circuitry A-1000 and the interface B-1000 via output communication signals OCs and sum signals Ts+ICs of triggering signals Ts, and input communication signals ICs.

The sum signals Ts+ICs of the output communication signals OCs and the triggering signals Ts can corresponds to modifications of the input communication signals ICs by the triggering signals Ts such that the triggering signals Ts in the sum signals Ts+ICs are detectable by the controller circuitry A-1000 and allows the controller circuitry A-1000 to switch from the normal mode to the diagnostic mode while the information commensurate with the input communication signals ICs is not corrupted and/or modified. For example, the sum signals Ts+ICs can correspond to the triggering signals TS followed by the input communication signals ICs.

The diagnostic tool C-1000 can be any type of circuitry, e.g. computer, processors, with software instructions, e.g. Exxotest® software, that performs diagnostics and/or maintenance functionalities, e.g. booting, tests, programming, or the like, on the controller circuitry A-1000 to make sure that the lighting system 100 operates accordingly to predetermined specifications and/or regulations. The input and output communication signals ICs, OCs can be commensurate with any type of communications between the diagnostic tool C-1000 and the controller circuitry A-1000 and any tasks, actions, and/or functions performed on the controller circuit A-1000 by the diagnostic tool C-1000 such as testing tasks, rebooting actions, programming functions or the like. The serial communication system 1000 presented in this disclosure allows communication without using dedicated path, connectors and/or pins such as LIN pins as it is the case for conventional serial communication systems.

In other words, the serial communication system 1000 presented enables to use connectors and/or pins that are already in used in the normal mode of operation which limits the number of elements and/or parts and reduces manufacturing costs.

To provide communication between the controller circuitry A-1000 and the diagnostic tool C-1000, the serial communication system 1000 relies on the input path and the output path that are employed to receive the sensing signals Ss and send the actuation signals As, as well as the triggering signal Ts to switch from the normal mode of operation to the diagnostic mode of operation.

Figure 2A:
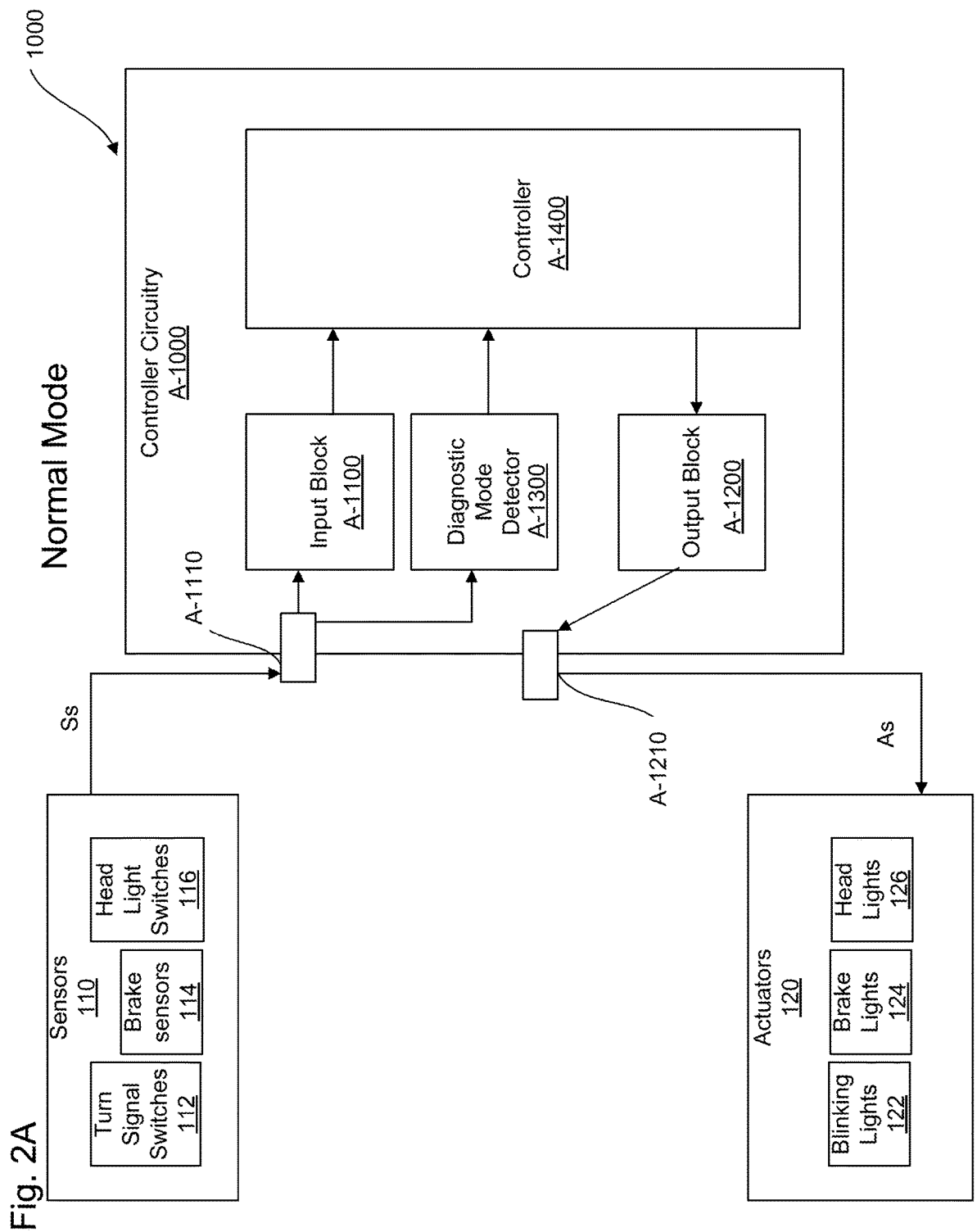
FIG. 2A is a schematic view of a serial communication system of the lighting system in the normal mode of operation, according to certain aspects of the disclosure.

FIGS. 2A-2B is a schematic view of a serial communication system 1000 of the lighting system 100 in the normal mode of operation and in the diagnostic mode of operation, according to certain aspects of the disclosure.

The serial communication system 1000 can include the controller circuitry A-1000, the diagnostic tool C-1000, and an interface circuitry B-1000 that connects the controller circuitry A-1000 with the diagnostic tool C-1000 to provide communication between the controller circuitry A-1000 and the diagnostic tool C-1000.

The controller circuitry A-1000 can include an input block A-1100 that receives, via an input pin A-1110 the sensing signals Ss from the sensors 110 in the normal mode of operation (as illustrated in FIG. 2A) or that receives the sum signals Ts+ICS and the input communication signals ICs from the interface circuitry B-1000 in the diagnostic mode (as illustrated in FIG. 2B), an output block A-1200 that sends, via an output pin A-1210 the actuation signals As in the normal mode of operation (as illustrated in FIG. 2A) or that sends the output communication signals OCs in the diagnostic mode of operation (as illustrated in FIG. 2B), a diagnostic mode detector A-1300 connected to the input block A-1100, and a controller A-1400 connected to the input block A-1100, the output block A-1200, and the diagnostic mode detector A-1300.

The interface circuitry B-1000 is configured to connect to the controller A-1400 via the input pin A-1110 and the output pin A-1210 and to connect to the diagnostic tool C-1000 via a serial connector C-1100, e.g. BUS SUB-D9 connector, and to send the sum signals Ts+ICs to the input pin A-1110 where the triggering signals Ts present in the sum signals Ts+ICs are detected by the diagnostic mode detector A-1300.

Figure 3A:
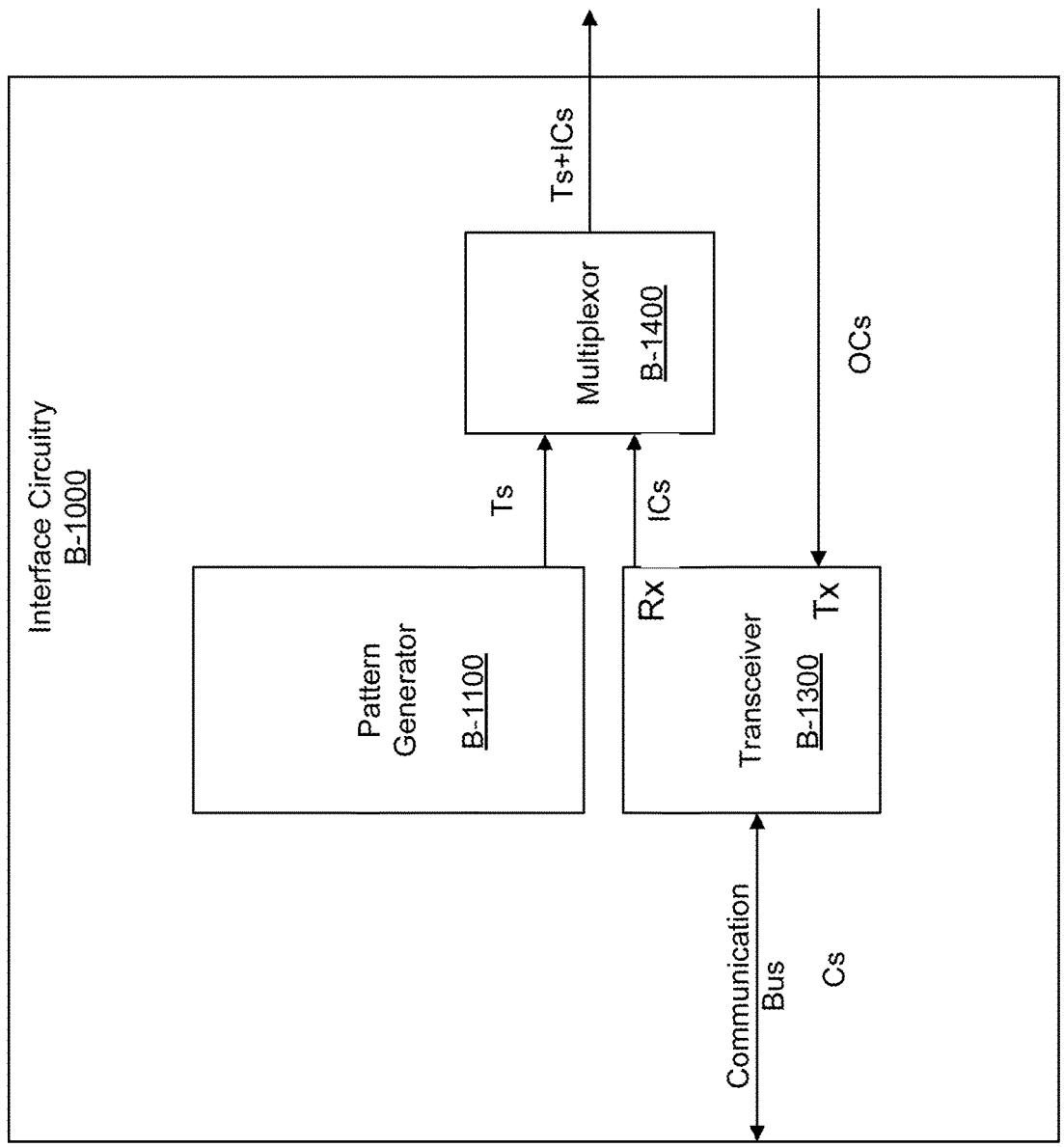
FIG. 3A is a schematic view of an interface circuitry of the serial communication system, according to certain aspects of the disclosure.
Figure 3B:
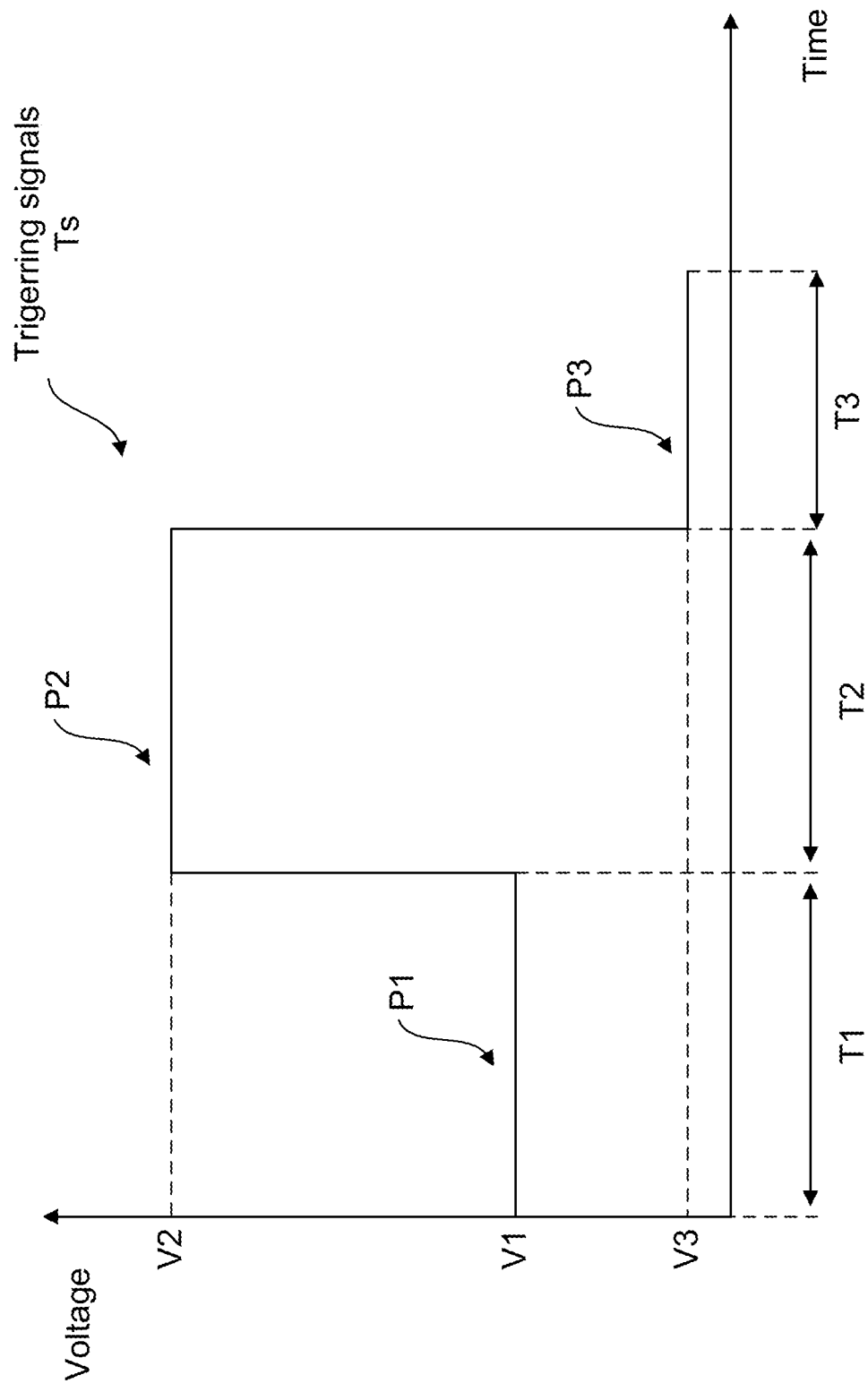
FIG. 3B is a graphical representation of a first expression of a trigger signal generated by the interface circuitry, according to certain aspects of the disclosure.
Figure 3C:
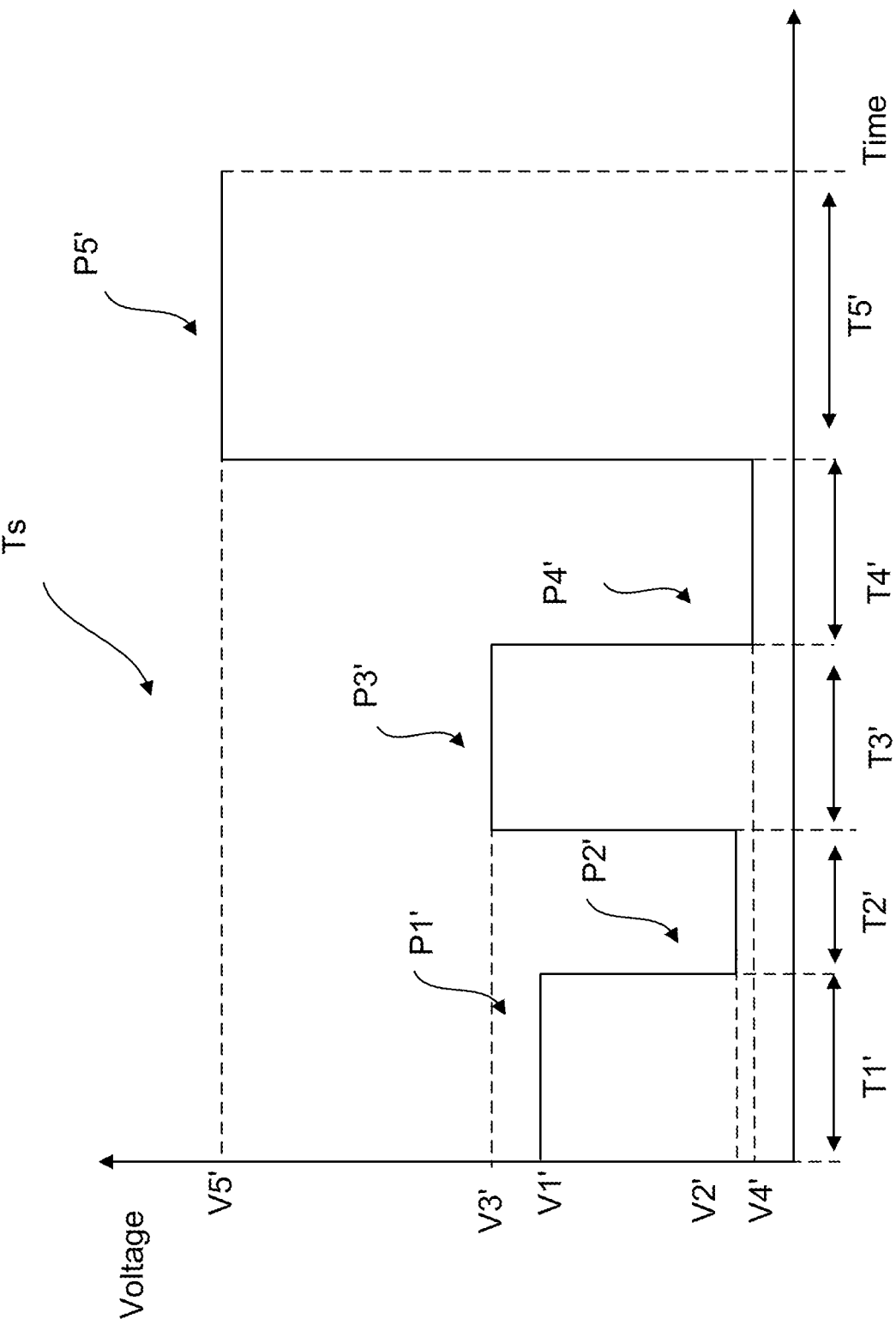
FIG. 3C is a graphical representation of a second expression of the trigger signal generated by the interface circuitry, according to certain aspects of the disclosure.

FIGS. 3A-3C are a schematic view of the interface circuitry B-1000 of the serial communication system 1000, a graphical representation of a first expression of the triggering signals Ts generated by the interface circuitry B-1000, and a graphical representation of a second expression of the triggering signals Ts generated by the interface circuitry B-1000, according to certain aspects of the disclosure.

The interface circuitry B-1000 can include, a transceiver B-1300 connectable to the diagnostic tool C-1000, a pattern generator B-1100 connected to the transceiver B-1300 and the input pin A-1110, and a multiplexor B-1400 connected to the transceiver B-1300 and the pattern generator B-1100. The transceiver B-1300 can transmit the communication signals Cs to and from the diagnostic tool C-1000 as well as to send the input communication signals ICs from the diagnostic tool C-1000 and to receive the communication output signals OCs from the controller circuitry A-1000.

For example, the transceiver B-1300 can be a CAN transceiver to communicate with the diagnostic tool C-1000 via a CAN communication bus, or a LIN transceiver to communicate with the diagnostic tool C-1000 via a LIN communication bus.

The pattern generator B-1100 is configured to generate the triggering signals Ts and send the triggering signals Ts to the multiplexor B-1400.

The triggering signals Ts present in the sum signals Ts+ICs can be configured to be detected by the diagnostic mode detector A-1300 while leaving other elements of the lighting system 100, e.g. the sensors 110, the actuators 120, and/or the controller circuitry A-1000, unperturbed and undamaged. For example, the controller circuitry A-1000, and/or the actuators 120 are not intentionally actuated and/or over loaded.

For example, the triggering signals Ts can correspond to voltage values that vary between predetermined extremum voltage values over a predetermined time periods, wherein the predetermined extremum voltage values and the predetermined time periods are sufficiently important to be detected by the diagnostic mode detector A-1300 but sufficiently small to not perturb and/or damage the lighting system 100 during the normal mode of operation.

In one illustrative example, the triggering signals Ts can correspond to voltage values that follow a multiplateau function characterized by a first plateau P1 at a first voltage threshold V1 during a first period T1, a second plateau P2 at a second voltage threshold V2 during a second period T2, and a third plateau P3 at a third voltage threshold V3 during a third period T3, as illustrated in FIG. 3B.

For example, the first voltage threshold V1 can be between 2.00 V and 3.80 V, preferably between 2.40 V and 3.40 V, the second voltage threshold V2 can be between 3.50 V and 6.50 V, preferably between 4.25 V and 5.75 V, the third voltage threshold V3 can be between −0.30 V and 0.30 V, preferably between −0.15 V and 0.15 V, the first period T1 can be between 80 ms and 120 ms, preferably between 90 ms and 110 ms, the second period T2 can be between 80 ms and 120 ms, preferably between 90 ms and 110 ms, and the third period T3 can be between 80 ms and 120 ms, preferably between 90 ms and 110 ms.

The first period T1, the second period T2, and the third period T3 can be substantially equal by having variation values within a margin of 20%, 10% or preferably 5%.

In another illustrative example, the triggering signals Ts can correspond to voltage values that follow a multiplateau function characterized by a first plateau P1' at a first voltage threshold V1' during a first period T1', a second plateau P2' at a second voltage threshold V2' during a second period T2', a third plateau P3' at a third voltage threshold V3' during a third period T3', a fourth plateau P4' at a fourth voltage threshold V4' during a fourth period T4'. and a fifth plateau P5' at a fifth voltage threshold V5' during a fifth period T5', as illustrated in FIG. 3C.

For example, the first voltage threshold V1' can be between 2.00 V and 3.80 V, preferably between 2.40 V and 3.40 V, the second voltage threshold V2' can be between −0.30 V and 0.30 V, preferably between −0.15 V and 0.15 V, the third voltage threshold V3' can be between 2.00 V and 3.80 V, preferably between 2.40 V and 3.40 V, the fourth voltage threshold V4' can be between −0.30 V and 0.30 V, preferably between −0.15 V and 0.15 V, the fifth voltage threshold V5' can be between 3.50 V and 6.50 V, preferably between 4.25 V and 5.75 V, the first period T1' can be between 80 ms and 120 ms, preferably between 90 ms and 110 ms, the second period T2' can be between 80 ms and 120 ms, preferably between 90 ms and 110 ms, the third period T3' can be between 80 ms and 120 ms, preferably between 90 ms and 110 ms, the fourth period T4' can be between 80 ms and 120 ms, preferably between 90 ms and 110 ms, the fifth period T5' can be between 80 ms and 120 ms, preferably between 90 ms and 110 ms.

The first period T1', the second period T2', the third period T3', the fourth period T4', and the fifth period T5' can be substantially equal by having variation values within a margin of 20%, 10% or preferably 5%.

The multiplexor B-1400 can be configured to receive the triggering signal Ts and the input communication signals ICs, combine the triggering signal Ts to the input communication signals ICs to provide the sum signals Ts+ICs such that the triggering signals Ts in the sum signals Ts+ICs are detectable by the controller circuitry A-1000 and allows the controller circuitry A-1000 to switch from the normal mode to the diagnostic mode while the information commensurate with the input communication signals ICs is not corrupted and/or modified. For example, the sum signals Ts+ICs can correspond to the triggering signals Ts fallowed by the input communication signals ICs.

Figure 4:
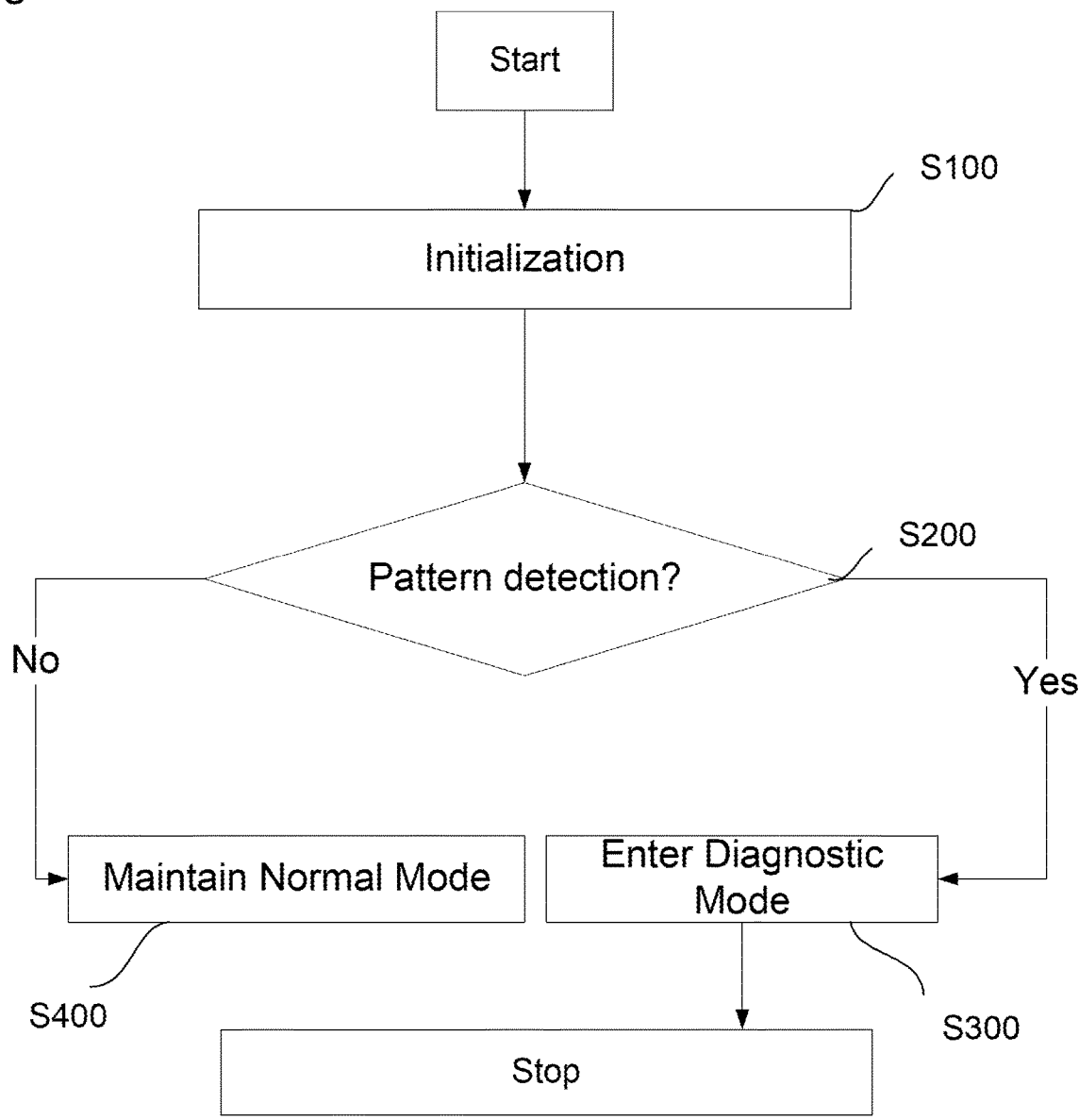
FIG. 4 is a chart flow of a method for establishing communication between a diagnostic tool and a controller circuitry via the interface circuitry, according to certain aspects of the disclosure.

FIG. 4 is a chart flow of a method for establishing communication between the diagnostic tool C-1000 and the controller circuitry A-1000 through the interface circuitry B-1000, according to certain aspects of the disclosure.

In a step S100, the initialization phase is started. In the initialization phase, the controller circuitry A-1000 is powered by an external power source, e.g. battery, and the pattern generator B-1100 of the interface circuitry B-1000 generates the triggering signals Ts through software instructions executed on the diagnostic tool C-1000, and the controller A-1400 receives the triggering signals Ts.

In the step S200, it is determined if the switch from the normal mode of operation to the diagnostic mode of operation is needed. The need of the switch from the normal mode of operation to the diagnostic mode of operation can be determined by software instructions executed on the controller A-1400 and/or the diagnostic mode detector A-1300 that detect the triggering signal Ts. For example, voltage values of the input signals passing through the input pin A-1110 can be monitor and compare to the triggering signals Ts to identify similarities based on voltage values and time periods, e.g. the first voltage threshold V1, the second voltage threshold V2, and/or the third voltage threshold V3.

If the need to switch from the normal mode of operation to the diagnostic mode of operation is detected, the process goes to a step S300, Otherwise the process goes to the step S400.

In the step S300, the process enters in the diagnostic mode of operation. In the diagnostic mode of operation, LIN communications are transmitted between the diagnostic tool C-1000 and the controller A-1400 through the interface circuitry B-1000, the input block A-1100 for the input communication signals ICs, and through the output block A-1200 for the output communication signals OCs.

In addition, the actuators 120, e.g. blinking lights 122, brake lights 124, and/or head lights 126, are switched off.

In the step S400, the process maintains the normal mode of operation and the actuators 120 can receive the actuation signals As and actuate the light sources according to the actuation signals As, e.g. actuate the blinking lights 122, the brake lights 124, the head lights 126, or the like.

The foregoing discussion discloses and describes merely exemplary embodiments of an object of the present disclosure. As will be understood by those skilled in the art, an object of the present disclosure may be embodied in other specific forms without departing from the spirit or essential characteristics thereof. Accordingly, the present disclosure is intended to be illustrative, but not limiting of the scope of an object of the present disclosure as well as the claims.

Numerous modifications and variations on the present disclosure are possible in light of the above teachings. It is therefore to be understood that within the scope of the appended claims, the disclosure may be practiced otherwise than as specifically described herein.

What is claimed is:

1. A lighting system for a vehicle, the lighting system comprising:
   sensors that provide at least one sensing signal;
   actuators that receive at least one actuation signal, and actuate different types of light sources according to the at least one actuation signal, the different types of light sources including at least blinking lights, brake lights, and head lights;
   a diagnostic tool that provides at least one input communication signal and receives at least one output communications signal;
   a serial communication system including:
      an interface circuitry that generates at least one triggering signal; and
      a controller circuitry including:
         an input block,
         an output block,
         a diagnostic mode detector configured to:
            receive the at least one triggering signal, and
            detect the at least one triggering signal, and
         a controller connected to the input block, the output block, and the diagnostic mode detector, the controller being configured to function in a normal mode or in a diagnostic mode when the at least one triggering signals is detected by the diagnostic mode detector, wherein
            in the normal mode the controller receives the at least one sensing signal and provides the at least one actuating signal based on the at least one sensing signal, and
            in the diagnostic mode the input block transmits the at least one input communication signal from the diagnostic tool to the controller and the output block transmits the at least one output communication signal from the controller to the diagnostic tool.

2. The lighting system of claim 1, wherein the at least one triggering signal includes time dependent voltage values defined by a multi-plateau function.

3. The lighting system of claim 2, wherein the multi-plateau function comprises a first plateau at a first voltage threshold during a first period, a second plateau at a second voltage threshold during a second period, and a third plateau at a third voltage threshold during a third period.

4. The lighting system of claim 3, wherein the second voltage threshold is higher than the first voltage threshold and the third voltage threshold is lower than the first voltage threshold.

5. The lighting system of claim 4, wherein the first voltage threshold is between 2.00 V and 3.40 V, the second voltage threshold is between 3.50 V and 6.50 V, and the third voltage threshold is between −0.30 V and 0.30 V.

6. The lighting system of claim 3, wherein the first period, the second period, and the third period are substantially equal.

7. The lighting system of claim 6, wherein the first period is between 80 ms and 110 ms.

8. The lighting system of claim 1, wherein the actuators are light sources of the vehicle.

9. The lighting system of claim 1, wherein the at least one input communication signal and the at least one output communication signal are commensurate with performing diagnostics on the controller.

10. The lighting system of claim 1, wherein the interface circuitry includes a pattern generator to produce the at least one triggering signal.

11. A serial communication system for a vehicle, the serial communication system comprising:
    an interface circuitry that generates at least one triggering signal; and
    a controller circuitry including
        an input block,
        an output block,
        a diagnostic mode detector configured to
            receive the at least one triggering signal, and
            detect the at least one triggering signal, and
        a controller connected to the input block, the output block and the diagnostic mode detector, the controller being configured to function in a normal mode or in a diagnostic mode when the at least one triggering signal is detected by the diagnostic mode detector, wherein
            in the normal mode the controller receives at least one sensing signal and provides at least one actuation signal based on the at least one sensing signal, wherein actuators of a lighting system for the vehicle receives the at least one actuation signal and actuate different types of light sources according to the at least one actuation signal, the different types of light sources including at least blinking lights, brake lights, and head lights, and
            in the diagnostic mode the input block transmits at least one input communication signal from the interface circuitry and the output block transmits at least one output communication signal from the controller to the interface circuitry.

12. The lighting system of claim 11, wherein the at least one triggering signal includes time dependent voltage values that follow a multi-plateau function.

13. The lighting system of claim 12, wherein the multi-plateau function is characterized by a first plateau at a first voltage threshold during a first period, a second plateau at a second voltage threshold during a second period, and a third plateau at a third voltage threshold during a third period.

14. The lighting system of claim 13, wherein the second voltage threshold is higher than the first voltage threshold and the third voltage threshold is lower than the first voltage threshold.

15. The lighting system of claim 11, wherein the interface circuitry includes a pattern generator to produce the at least one triggering signal.

16. A controller circuitry for a vehicle, the controller circuitry comprising:
    an input block;
    an output block;
    a controller connected to the input block and the output block, the controller being configured to function in a normal mode or in a diagnostic mode, wherein
        in the normal mode the controller receives at least one sensing signal and provides at least one actuation signal based on the at least one sensing signal, wherein actuators of a lighting system for the vehicle receives the at least one actuation signal and actuate different types of light sources according to the at least one actuation signal, the different types of light sources including at least blinking lights, brake lights, and head lights, and
        in the diagnostic mode the input block receives at least one input communication signal and the output block sends at least one output communication signal; and
    a diagnostic mode detector connected to the input block and configured to
        receive at least one triggering signal,
        detect the at least one triggering signal, and
        switch the controller from the normal mode to the diagnostic mode when the at least one triggering signal is detected.

17. The lighting system of claim 16, wherein the at least one triggering signal includes time dependent voltage values that follow a multi-plateau function.

18. The lighting system of claim 17, wherein the multi-plateau function is characterized by a first plateau at a first voltage threshold during a first period, a second plateau at a second voltage threshold during a second period, and a third plateau at a third voltage threshold during a third period.

19. The lighting system of claim 18, wherein the second voltage threshold is higher than the first voltage threshold and the third voltage threshold is lower than the first voltage threshold.

20. The lighting system of claim 19, wherein the first voltage threshold is between 2.00 V and 3.40 V, the second voltage threshold is between 3.50 V and 6.50 V, and the third voltage threshold is between −0.30 V and 0.30 V.

* * * * *